US006891423B2

(12) United States Patent
Björk et al.

(10) Patent No.: US 6,891,423 B2
(45) Date of Patent: May 10, 2005

(54) QUADRATURE SWITCHING MIXER WITH REDUCED LEAKAGE

(75) Inventors: Christian Björk, Lund (SE); Magnus Wiklund, Lund (SE); Sven Mattisson, Bjärred (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 58 days.

(21) Appl. No.: 10/383,370

(22) Filed: Mar. 6, 2003

(65) Prior Publication Data

US 2003/0222702 A1 Dec. 4, 2003

Related U.S. Application Data

(60) Provisional application No. 60/370,322, filed on Apr. 4, 2002.

(51) Int. Cl.$^7$ .................................. G06G 7/12
(52) U.S. Cl. ...................................... 327/355
(58) Field of Search ............... 327/355, 356, 327/357, 359, 361; 455/189.1, 326, 333, 209

(56) References Cited

U.S. PATENT DOCUMENTS

| | | | |
|---|---|---|---|
| 5,155,724 A | | 10/1992 | Edwards |
| 5,410,743 A | | 4/1995 | Seely et al. |
| 6,026,287 A | | 2/2000 | Puechberty et al. |
| 6,124,761 A | * | 9/2000 | Robinson et al. ........... 330/254 |
| 6,226,509 B1 | | 5/2001 | Mole et al. |
| 6,417,712 B1 | * | 7/2002 | Beards et al. ............... 327/248 |
| 2001/0027095 A1 | | 10/2001 | Wang |
| 2001/0036818 A1 | | 11/2001 | Dobrovotny |

FOREIGN PATENT DOCUMENTS

| | | |
|---|---|---|
| DE | 195-23-433 A1 | 1/1997 |
| DE | 198-19-092 A1 | 11/1999 |
| EP | 1 137 168 A2 | 9/2001 |
| GB | 2 249 679 A | 5/1992 |
| GB | 2 341 502 A | 3/2000 |

OTHER PUBLICATIONS

Wiklund, et al, "A 2Ghz Image–Reject Receiver in a Low IF Architecture Fabricated in a 0.1 $\mu$m CMOS Technology"; Apr. 4, 2002, Lund, Sweden.

Abidi, A., "CMOS Wireless Transceivers: The New Wave", IEEE Communications Magazine, Aug. 1, 1999, vol. 37, No. 8, (pp. 119–124).

Butler, N., International Search Report completed by European Patent Office on Nov. 27, 2003 (7 pages).

* cited by examiner

*Primary Examiner*—My-Trang Nu Ton
(74) *Attorney, Agent, or Firm*—Jenkens & Gilchrist, P.C.

(57) ABSTRACT

A quadrature switching mixer is provided for mixing a received RF signal and a local oscillator signal, while rejecting an image signal associated with the RF signal. Input signal components in quadrature, that is, I and Q input components derived from the received RF signal, are respectively coupled through first and second input paths to corresponding commuting switches in a configuration of switches. Each of the switches operates to multiply respective quadrature components of RF and local oscillator signals to provide quadrature output signal components. A unidirectional device, such as a buffer amplifier included in a signal splitter, is placed in each input path to prevent any portion of an output signal component from leaking backward through one of the input paths to the other input path, and thus to the other output signal component.

26 Claims, 4 Drawing Sheets

QUADRATURE SWITCHING MIXER WITH REDUCED LEAKAGE

CROSS REFERENCE TO RELATED APPLICATION

This application for patent claims the benefit of priority from, and hereby incorporates by reference the entire disclosure of, co-pending U.S. Provisional Application for Pat. No. 60/370,322, filed Apr. 4, 2002.

BACKGROUND OF THE INVENTION

1. Technical Field of the Invention

The invention disclosed and claimed herein generally pertains to an apparatus for use in connection with a quadrature switching mixer configured to reject an image signal associated with a received RF signal. More particularly, the invention pertains to an apparatus of the above type which substantially reduces leakage between the in phase (I) and quadrature (Q) output branches of the mixer, and thereby improves the conversion gain of the mixer and avoids deterioration of the mixer output signal.

2. History of the Related Art

In radio equipment, the signals transmitted through the air occupy one frequency band, whereas the signals that are processed occupy a considerably lower frequency band. Accordingly, a mixer is used to translate or convert the radio frequency signals to an intermediate frequency (IF). The mixing process, or heterodyning, is multiplicative, that is, the input signal is multiplied by a local oscillator signal (in the time domain). As a result of the multiplication, however, the output of the mixer may include contributions from the desired signal as well an undesired image signal. Those of ordinary skill in the radio reception art know that the image signal is a signal whose frequency is capable of being converted, via the mixing process, to the same IF as the desired signal.

Image rejection mixers have been developed which use the principle of canceling to reduce the contribution of the image signal at the mixer output. In one commonly used type of image rejection mixer, the desired input signal (RF) is split into two signal components: an in-phase (I) component ($RF_I$) and a quadrature (Q) component ($RF_Q$). The quadrature (Q) signal is delayed 90 degrees relative to the in-phase (I) signal, that is: $RF_Q(\omega t)=RF_I(\omega t-\pi/2)$. The local oscillator signal is also split into a quadrature signal $LO_Q$ which is delayed 90 degrees relative to the in-phase oscillator signal $LO_I$. Mathematically, in complex notation, the image rejection mixer works as a multiplication of the input signal $RF_I+jRF_Q$ with the local oscillator signal $LO_I+jLO_Q$.

As described hereinafter in further detail, the multiplication is usually implemented with commuting switches. Each commuting switch has a pair of complementary switches SW and $\overline{SW}$. When the SW switch is closed, the output signal of the commuting switch has the same polarity as the input signal, and when the $\overline{SW}$ switch is closed, the output signal of the commuting switch has a different polarity than the input signal. Summing junctions are then provided for cancellation of the components representing the undesired image signal. This type of image rejection mixer is referred to as a quadrature switching mixer.

The components for a quadrature switching mixer of the type described above can be fabricated using any suitable semiconductor technology such as CMOS, BJT, and the like. This provides certain important advantages when the mixers are used in wireless receivers for small portable electronic devices, such as mobile phones and the like for use in UMTS (Universal Mobile Telecommunications System), Bluetooth, and other wireless communication systems. CMOS based quadrature switching mixers, however, have a serious drawback in that the I and Q output signal components of the mixer, $OUT_I$ and $OUT_Q$ respectively, tend to short together. That is, a portion of one of the quadrature branch outputs may flow backward through one of the switches in the mixer, and enter the input of the other branch. This leakage can cause a conventional quadrature image rejection mixer of the type mentioned above to become less useful in practice, because of the resulting large conversion loss. Moreover, the leakage between the two outputs $OUT_I$ and $OUT_Q$ deteriorates the cumulative mixer output signal and leads to poor image rejection ratios.

One presently used approach to reduce the leakage between the I and Q output signals of a quadrature switching mixer is to add resistors in series with the switches, thereby effectively isolating the I and Q branches from each other. A switch, however, should have low resistance when it is closed to minimize any signal loss. Adding isolation resistors introduces an additional loss. This loss can be significant, even though it is usually less than the loss resulting from leakage between the I and Q branch output signals. The added resistors also cause an undesirable voltage drop, especially if the signal is in current mode, which means that the input impedance of the mixer should be kept low. Therefore, it is undesirable to add any further resistors to the quadrature switching mixer.

Accordingly, it would be desirable to be able to reduce the leakage between the I and Q output signals of a quadrature switching mixer, and to be able to do so without introducing additional loss to the mixer such as from isolation resistors.

SUMMARY OF THE INVENTION

The present invention provides an effective and comparatively simple technique for substantially reducing leakage between the outputs of the I and Q branches of a quadrature switching mixer. In accordance with the invention, a unidirectional device, such as a component that is part of a signal splitter, is inserted into the input path of each switch of the mixer. Each of the unidirectional devices acts to prevent an output signal from one of the branches from leaking backward through an input path to the other branch output. Deterioration of the I and Q signals outputted from the quadrature switching mixer is thus significantly reduced. As a result, a passive quadrature switching mixer is made available that is highly linear, has low noise mixing capabilities, and can be efficiently used for image rejection mixing.

In one embodiment, the invention is directed to switching mixer apparatus for mixing an RF signal and a local oscillator signal. The apparatus comprises a configuration of switching devices, each of the switching devices configured to multiply respective in-phase (I) and quadrature (Q) components of the RF and LO signals to provide I and Q output signal components. The apparatus further comprises a first RF input path for coupling an I component of the RF signal to at least one of the switching devices, a second RF input path for coupling a Q component of the RF signal to at least one other of the switching devices, and a unidirectional signal processing device placed in at least one of the input paths for preventing an output signal component from passing backward through one of the input paths to the other input path.

In the above embodiment, each of the unidirectional devices usefully comprises a buffer amplifier or other component of a signal splitter. Usefully, respective components of the mixer apparatus are implemented in CMOS or other suitable technology for use in a portable electronic device such as a wireless telephone terminal.

A further embodiment of the invention is directed to a method for mixing RF and local oscillator signals to provide an IF signal from which the image frequency signal has been rejected. The method comprises the steps of processing the RF signal to provide corresponding I and Q input signal components, and coupling the I and Q input components through first and second input paths, respectively, to first and second pluralities of switching devices in a configuration of switching devices. The method further comprises operating each of the switching devices to multiply its received I or Q RF input component with an I or Q component, selectively, of the local oscillator signal to generate I and Q mixer output signal components. A unidirectional device is placed in each of the switching device input paths to prevent an output signal component associated with one of the input paths from passing backward into the other input path.

It should be emphasized that the term comprises/comprising, when used in this specification, is taken to specify the presence of stated features, integers, steps, or components, but does not preclude the presence or addition of one or more other features, integers, steps, components, or groups thereof.

BRIEF DESCRIPTION OF THE DRAWINGS

A more detailed understanding of the method and system of the present invention may be had by reference to the following detailed description when taken in conjunction with the drawings, wherein.

DETAILED DESCRIPTION OF THE INVENTION

Following is a detailed description of the invention with reference to the drawings wherein reference numerals for the same or similar elements are carried forward.

Figure 1:
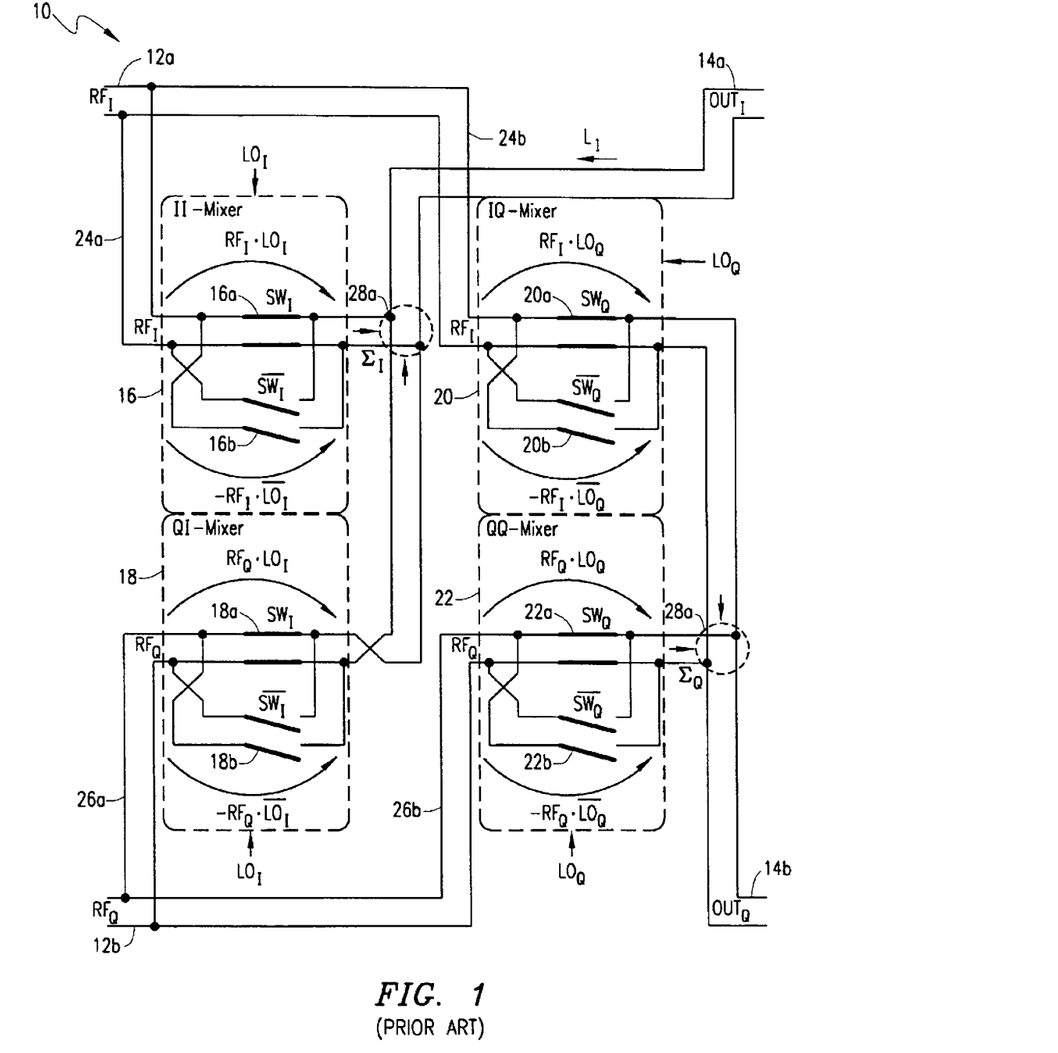
FIG. 1 is a schematic diagram showing a quadrature switching mixer of the prior art adapted for rejection of image signals.

As mentioned previously, the present invention provides an effective and comparatively simple technique for substantially reducing leakage between the outputs of the I and Q branches of a quadrature switching mixer. Referring now to FIG. 1, there is shown a quadrature switching mixer 10 of conventional design, wherein mixer 10 is capable of image signal rejection and is provided with quadrature input terminals 12a and 12b. Terminal 12a is adapted to receive the in-phase input RF signal component $RF_I$, and terminal 12b is adapted to receive the quadrature input RF signal component $RF_Q$, where $RF_Q(\omega t)=RF_I(\omega t-\pi/2)$. Mixer 10 is also provided with I and Q output terminals 14a and 14b, which respectively provide I and Q mixer output signal components $OUT_I$ and $OUT_Q$.

FIG. 1 further shows quadrature switching mixer 10 provided with commuting or commutating switches 16–22, which respectively comprise pairs of complementary switches 16a–b, 18a–b, 20a–b and 22a–b. The input signal component $RF_I$ is coupled to switches 16 (i.e., 16a and 16b) and 18 (i.e., 18a and 18b) by means of input paths 24a and 24b. Similarly, input signal component $RF_Q$ is coupled to switches 20 (i.e., 20a and 20b) and 22 (i.e., 22a and 22b) by means of input paths 26a and 26b. An I component $LO_I$ of a local oscillator signal is also coupled to commuting switches 16 and 18, and a component $LO_Q$ of the local oscillator signal is coupled to commuting switches 20 and 22. The quadrature signal component $LO_Q$ is delayed 90 degrees relative to the in-phase oscillator signal component $LO_I$. As stated above, each of the commuting switches is operable to multiply its received RF input signal component and its received local oscillator signal component. By providing each switch with complementary switches $SW_I$ and $\overline{SW_I}$, or $SW_Q$ and $\overline{SW_Q}$, the output signal from a switch is equal to the input signal to the switch when the non-complemented switch is closed, and the polarity of the signal is changed when the complemented switch is closed (i.e., $OUT(t)=sgn\{LO(t)\}\cdot RF(t)$).

Referring still to FIG. 1, there are shown the outputs of switches 16 and 18 coupled to a summing junction 28a ($\Sigma_I$) and the outputs of switches 20 and 22 coupled to a summing junction 28b ($\Sigma_Q$), to provide $OUT_I$ and $OUT_Q$, respectively.

In accordance with the image rejection feature of mixer 10, respective output components of the switches derived from the undesired image signal are cancelled out at the summing junctions.

In the prior art device shown in FIG. 1, leakage can occur between the output signal components $OUT_I$ and $OUT_Q$, via the RF inputs so that the output terminals 14a and 14b are effectively shorted together. For example, FIG. 1 shows a component $L_I$ of $OUT_I$ which may leak backwards to the $RF_I$ input, through switch 16a, and then forward through the $RF_Q$ input and switch 20a. Component $L_I$ could then be coupled forward through switch 20a to output terminal 14b. Similarly, a component $L_2$ of $OUT_Q$ may leak backward through switch 22a and then move through the RF inputs to switch 18a to become part of output $OUT_I$.

Figure 2:
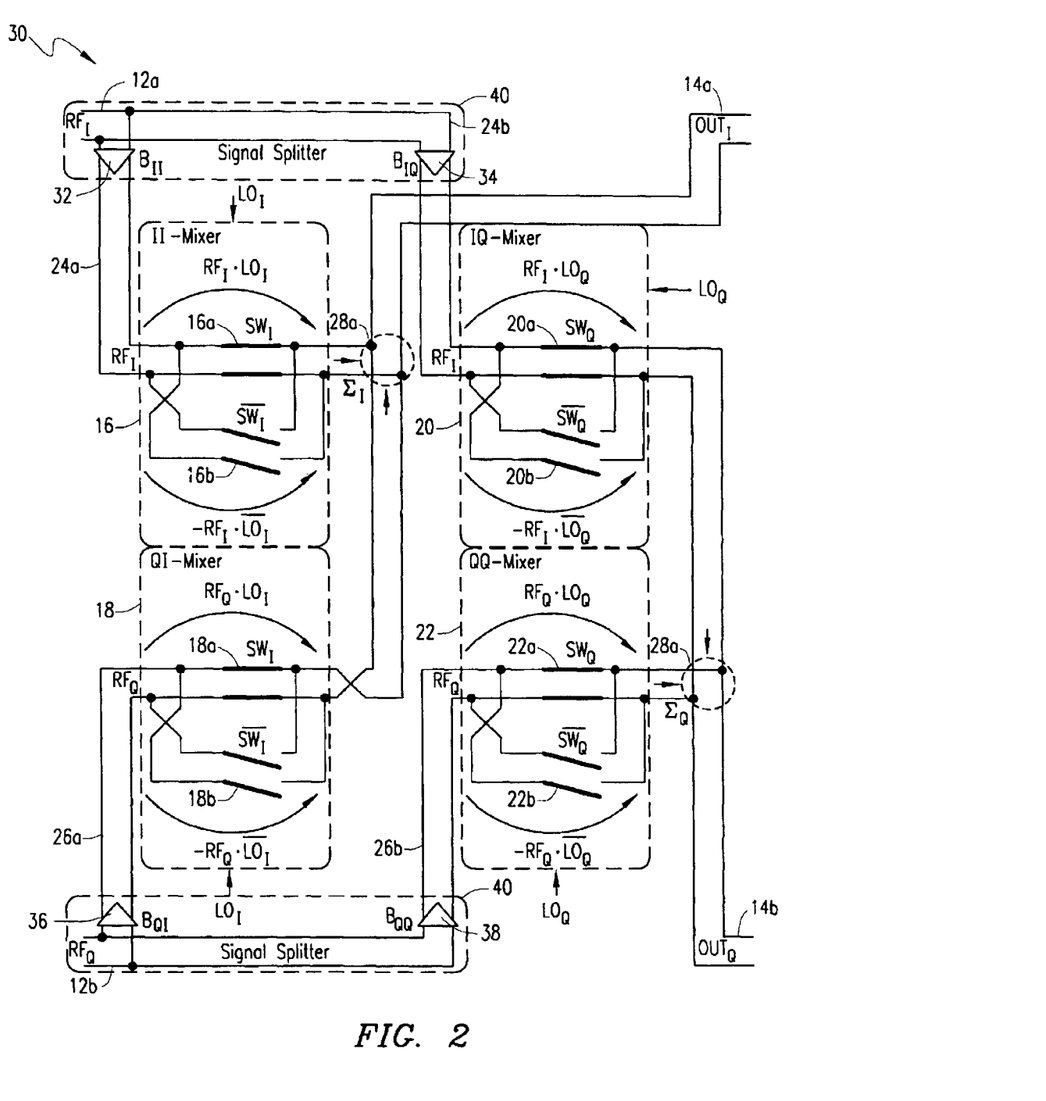
FIG. 2 is a schematic diagram showing an embodiment of the invention.

Referring to FIG. 2, there is shown a quadrature switching mixer 30 constructed in accordance with an embodiment of the invention. The mixer 30 is able to overcome the above output leakage problem of prior art devices, while at the same time perform image signal rejection as described above in connection with FIG. 1. Mixer 30 includes switches 16–22, terminals 12a–b and 14a–b and input paths 24a–b and 26a–b, which are identical or very similar to their respective same-numbered components shown in FIG. 1.

Referring further to FIG. 2, there is shown a mixer 30 provided with unidirectional buffer amplifiers 32–38, respectively. The unidirectional buffer amplifiers 32–38 together form a signal splitter 40, as described hereinafter in further detail. In accordance with embodiments of the invention, buffers 32 and 34 are inserted into input paths 24a and 24b, and thus receive the I input signal component $RF_I$. $RF_I$ is coupled to switches 16 and 18 through respective buffers 32 and 34, designated as $B_{I+}$ and $B_{I-}$. Similarly, buffers 36 and 38, designated as $B_{Q+}$ and $B_{Q-}$, are inserted into input paths 26a and 26b. The quadrature input signal component $RF_Q$ is then coupled through the buffers 36 and 38 to switches 20 and 22.

Since the buffers of the signal splitter 40 are unidirectional devices, they effectively prevent leakage between the I and Q branches of switching mixer 30. That is, portions of output signal components $OUT_I$ and $OUT_Q$ cannot be connected backward to the input of the other branch. This reduces deterioration of the output signals provided by the mixer 30 and enhances conversion gain thereof. Accordingly, the quadrature switching mixer 30 may be readily used to take advantage of highly linear and low noise mixing characteristics, and at the same time provide efficient image signal rejection mixing.

Figure 3:
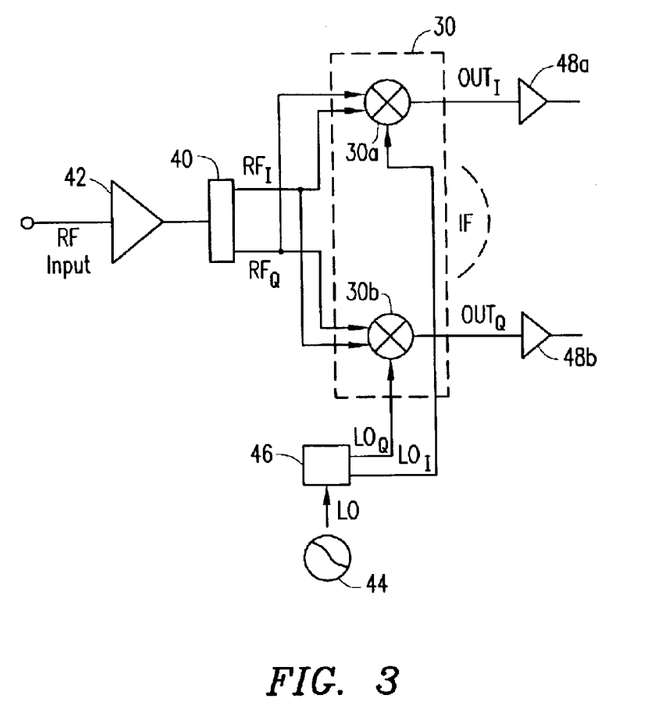
FIG. 3 is a block diagram showing an embodiment of the invention used to provide an IF stage in a receiver.

Referring to FIG. 3, there is shown the switching mixer 30 and the signal splitter 40 configured to serve as an intermediate frequency (IF) stage in a radio receiver. Such a radio receiver can be found in wireless devices such as mobile phones and the like that use UMTS, Bluetooth, and other wireless communication systems. The RF input signal is applied to a low noise amplifier (LNA) 42, and coupled therethrough to the signal splitter 40. The signal splitter 40, described hereinafter in further detail, is operable to supply both the RF input components $RF_I$ and $RF_Q$, which are respectively coupled to the mixer 30.

Referring further to FIG. 3, there is also shown an oscillator 44 generating the local oscillator signal LO, which is coupled to a phase shifter 46. A square-wave drive of the local oscillator 44 may be desirable in order to improve linearity and noise performance. However, a square-wave drive is hard to achieve at RF; instead the local oscillator signal may be sinusoidal, with a large amplitude to steepen the slope of the wave form. A phase shifter 46 provides both the in-phase local oscillator component $LO_I$ and the quadrature local oscillator component $LO_Q$. Phase shifter 46 usefully comprises an RC-CR network for generating the phase difference of 90 degrees needed to achieve the quadrature signal $LO_Q$.

In FIG. 3, component 30a of the mixer 30 represents the commuting switches 16 and 18 and summing junction $\Sigma_I$, which collectively produce the in-phase mixer output signal $OUT_I$. Similarly, component 30b of the mixer 30 represents the switches 20 and 22 and summing junction $\Sigma_Q$, which collectively produce the quadrature output signal $OUT_Q$. Accordingly, $RF_I$ and $LO_I$ are coupled to component 30a, and $RF_Q$ and $LO_Q$ are coupled to component 30b. FIG. 3 further shows mixer outputs $OUT_I$ and $OUT_Q$ coupled to buffer amplifier components 48a and 48b, respectively.

Figure 4:
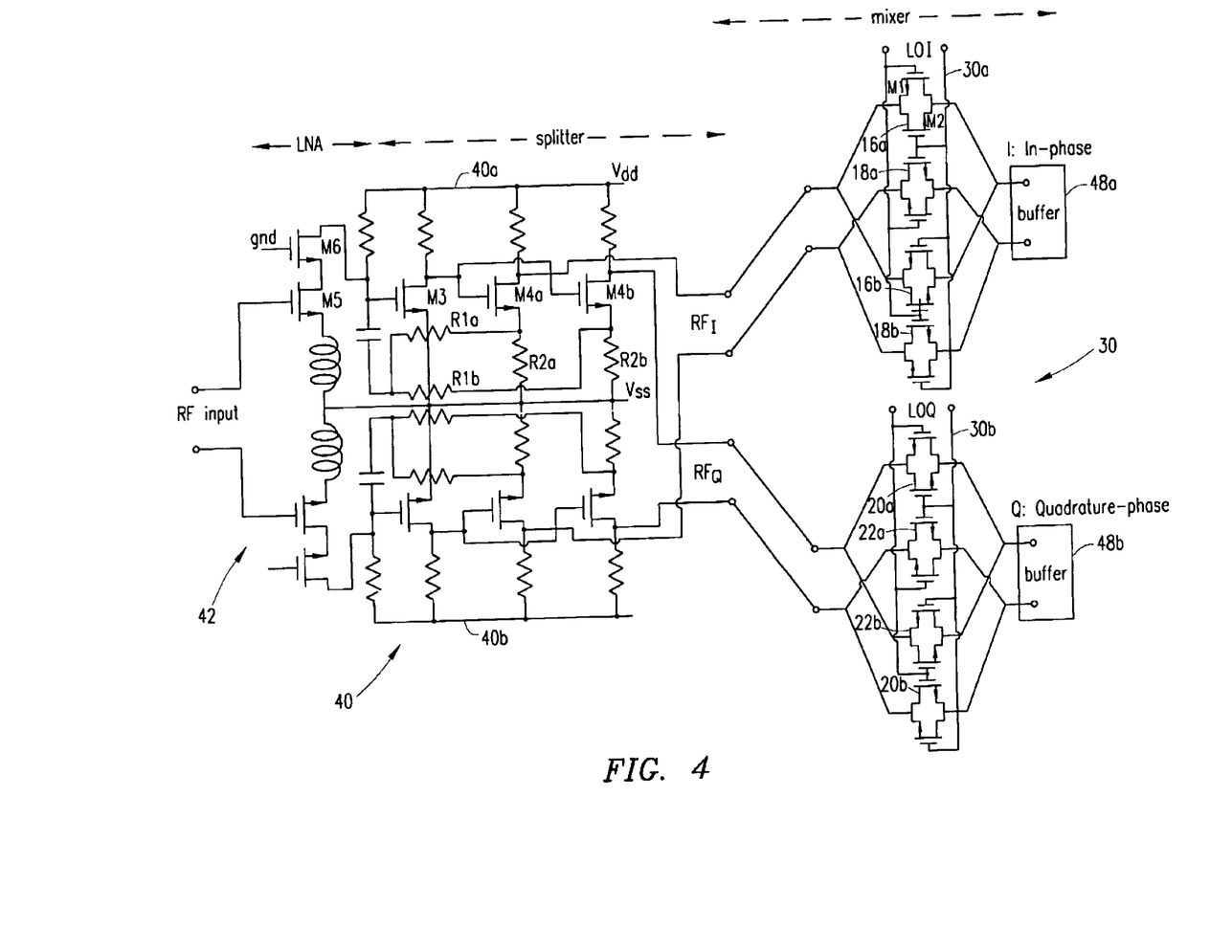
FIG. 4 is a schematic diagram showing components of the embodiment of FIG. 3 in further detail.

Referring to FIG. 4, there is shown LNA 42 comprising inductively degenerated common-source stage M5, followed by a common-gate stage M6. The LNA design provides low noise, about 1.6 dB, at a low current consumption. Usefully, a 1.6 dB noise figure corresponds to a drain current of 800÷µA and an aspect ratio of 112÷µm/0.1÷µm (W/L). This low drain current implies that stage M5 works near to the region of weak inversion, where the transconductance per unit of drain is at maximum, thus reducing the power consumption of the stage.

Referring further to FIG. 4, there is shown the signal splitter 40 receiving the RF input, amplified by LNA 42, to provide the in-phase signal component $RF_I$ and the quadrature signal component $RF_Q$. FIG. 4 further shows splitter 40 coupling the $RF_I$ and $RF_Q$ components to mixer components 30a and 30b.

Components of splitter 40 located above voltage line $V_{SS}$ as viewed in FIG. 4, and generally referenced collectively as 40a, cooperate to provide the positive-phase input components. The splitter component 40a acts as a current amplifier. It includes a common-source stage M3 that is connected to a second stage involving two identical transistors, M4a and M4b, which provide two identical output currents. These output currents are fed back via two identical resistive networks, (R2a, R1a) and (R2b, R1b), to the input of the M3 stage. The output of transistor M4a provides the $RF_I$ signal coupled to mixer component 30a, and the output of transistor M4b provides the $RF_Q$ signal coupled to mixer component 30b.

Signal splitter component 40b comprises a configuration of components located below voltage line $V_{SS}$ as viewed in FIG. 4, which is very similar to the configuration of splitter component 40a. Splitter component 40b provides the negative-phase input components which are coupled to mixer components 30a and 30b.

Switching mixer 30 is passive, double-balanced, and based on, for example, CMOS switches. FIG. 4 shows these switches realized as two complementary MOS transistors in pair, M1 and M2. Thus, each of the switches 16a–b through 22a–b comprises a pair of switches M1 and M2. The advantage with such a complementary switch, compared to a signal-transistor switch, is reduced on-resistance, which improves noise performance. In addition, charge injection from the local oscillator signals to the input signal and the output signal of mixer 30 is reduced. Moreover, because there is no DC current through the CMOS switches, flicker noise is reduced at the mixer 30 output. This consideration is particularly important in an embodiment with a low IF architecture, where low frequency is of concern. It should be noted, however, that other technology besides CMOS may also be used, such as BJT switches, without departing from the invention.

Referring further to FIG. 4, there are shown buffer amplifier components 48a and 48b coupled to receive the outputs of mixer components 30a and 30b, respectively. Usefully, buffer components 48a and 48b are respective components of a single-stage transimpedence amplifier.

Obviously, many other modifications and variations of the present invention are possible in light of the above teachings. It is therefore to be understood that within the scope of the disclosed concept, the invention may be practiced otherwise than as has been specifically described.

What is claimed is:

1. Switching mixer apparatus for mixing an RF signal and a local oscillator signal, said apparatus comprising:

a configuration of switching devices, said devices configured to multiply respective in-phase (I) and quadrature (Q) components of said RF and local oscillator signals to provide I and Q output signal components;

a first RF input path for coupling an I component of said RF signal to at least one of said switching devices, and a second input path for coupling a Q component of said RF signal to at least one other of said switching devices; and a unidirectional signal processing device disposed in each of said input paths for preventing a portion of one of said output signal components from passing through said at least one input path to the other one of said input paths.

2. The mixer apparatus of claim 1 wherein:

each of said unidirectional signal processing devices is part of a signal splitter.

3. The mixer apparatus of claim 2 wherein:

said signal splitter comprises a configuration of amplifier devices.

4. The mixer apparatus of claim 1 wherein:

said switching devices have outputs that are respectively combined to provide said I and Q output signal components.

5. The mixer apparatus of claim 3 wherein:

the output signals of a first pair of said switching devices are respectively coupled to a first summing junction, and the output signals of a second pair of said switching devices are coupled to a second summing junction, to cancel signal components representing an image signal associated with said RF signal.

6. The mixer apparatus of claim 5 wherein:

each of said switching devices comprises a commuting switch.

7. The mixer apparatus of claim 6 wherein:

each of said commuting switches comprises a pair of complementary switches.

8. The mixer apparatus of claim 1 wherein:

respective components of said mixer apparatus are implemented using semiconductor switches.

9. The mixer apparatus of claim 1 wherein:

said mixer apparatus is configured for use in a wireless communication device, said wireless communication device capable of being used in a wireless communication system, including Bluetooth and the Universal Mobile Telecommunications System.

10. The mixer apparatus of claim 1 further comprising:

a low-noise amplifier stage connected between said first and second RF input paths and said RF signal.

11. In a receiver configured to receive an RF signal and a local oscillator signal, an apparatus for mixing said RF signal and said local oscillator signal comprising:

a quadrature switching mixer having first and second input paths and configured to provide in-phase (I) and quadrature (Q) output signals, and a unidirectional signal processing device placed in each of said input paths for preventing a portion of one of said I or Q output signals from passing through one of said input paths to the other one of said input paths.

12. The receiver of claim 11 wherein:

each of said unidirectional signal processing devices is part of a signal splitter.

13. The receiver of claim 12 wherein:

said signal splitter comprises a configuration of amplifier devices.

14. The receiver of claim 12 wherein:

said quadrature switching mixer comprises a configuration of switching devices.

15. The receiver of claim 14 wherein:

output signals of a first pair of said switching devices are respectively coupled to a first summing junction, and output signals of a second pair of said switching devices are respectively coupled to a second summing junction, to cancel signal components representing an image signal associated with said RF signal.

16. The receiver of claim 15 wherein:

each of said switching devices comprises a pair of complementary switches.

17. The receiver of claim 16 wherein:

respective components of said quadrature switching mixer are implemented using semiconductor switches.

18. The receiver of claim 11 wherein:

said receiver is configured for use in a wireless communication device, said wireless communication device capable of being used in a wireless communication system, including Bluetooth and the Universal Mobile Telecommunications System.

19. The receiver of claim 11 further comprising:

a low-noise amplifier stage connected between said first and second input paths and said RF signal.

20. A method for mixing RF and local oscillator signals while rejecting an image signal associated with the RF signal, said method comprising the steps of:

processing said RF signal to provide corresponding in-phase (I) and quadrature (Q) input components;

coupling said I input component through a first input path to a first plurality of switching devices in a configuration of switching devices, and coupling said Q input component through a second input path to a second plurality of switching devices in said configuration of switching devices;

operating each of said switching devices to multiply its received I or Q input component with a respective I or Q component of said local oscillator signal to generate I and Q output signals; and placing a unidirectional device in each of said input paths for preventing a portion of one of said output signals from passing backward through one of said input paths into the other one of said input paths.

21. The method of claim 20 wherein:

each of said switching devices comprises an amplifier device included in a signal splitter.

22. The method of claim 21 wherein:

said method further includes summing the output signals of a first pair of said switching devices and of a second pair of said switching devices to cancel signal components representing said image signal associated with said RF signal.

23. The method of claim 22 wherein:

each of said switching devices comprises a pair of complementary switches.

24. The method of claim 23 wherein:

each of said complementary switches are implemented using semiconductor switches.

25. The method of claim 19 wherein:

said method is implemented in a wireless communication device, said wireless communication device capable of being used in a wireless communication system, including Bluetooth and the Universal Mobile Telecommunications System.

26. The method of claim 19 further comprising:

connecting a low-noise amplifier stage between said first and second input paths and said RF signal.

* * * * *

UNITED STATES PATENT AND TRADEMARK OFFICE
CERTIFICATE OF CORRECTION

PATENT NO.         : 6,891,423 B2
APPLICATION NO. : 10/383370
DATED                 : May 10, 2005
INVENTOR(S)       : Christian Björk et al.

It is certified that error appears in the above-identified patent and that said Letters Patent is hereby corrected as shown below:

| | |
|---|---|
| Face of Patent, U.S. Patent Documents Section | Insert --2001/0001543  05/2001  Sasaki<br>6304142  10/2001  Madni<br>2002/0008983  01/2002  Soul-Diez et al.<br>6054889  04/2000  Kobayashi<br>6037825  03/2000  Kung<br>5872446  02/1999  Cranford, Jr. et al<br>5589791  12/1996  Gilbert<br>5570056  10/1996  Groe<br>5311086  05/1994  Yamaji et al.<br>5179731  01/1993  Trankle et al.-- |
| Face of Patent, Foreign Patent Documents Section | Insert --EP 0 942 526  09/1999<br>WO 98/47221  10/1998-- |
| Figures 1-3 and 4 | Please replace existing Figures 1-3 and 4 with attached Figures 1-3 and 4 |
| Column 7, line 27, Claim 11 | Replace "signals, and" With --signals; and-- |

Signed and Sealed this

Twenty-first Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 6,891,423 B2  
APPLICATION NO. : 10/383370  
DATED : May 10, 2005  
INVENTOR(S) : Christian Björk et al.

It is certified that error appears in the above-identified patent and that said Letters Patent is hereby corrected as shown below:

| | | | |
|---|---|---|---|
| Face of Patent, U.S. Patent Documents Section | Insert -- 2001/0001543 | 05/2001 | Sasaki |
| | 6304142 | 10/2001 | Madni |
| | 2002/0008983 | 01/2002 | Soul-Diez et al. |
| | 6054889 | 04/2000 | Kobayashi |
| | 6037825 | 03/2000 | Kung |
| | 5872446 | 02/1999 | Cranford, Jr. et al |
| | 5589791 | 12/1996 | Gilbert |
| | 5570056 | 10/1996 | Groe |
| | 5311086 | 05/1994 | Yamaji et al. |
| | 5179731 | 01/1993 | Trankle et al.-- |
| Face of Patent, Foreign Patent Documents Section | Insert -- EP 0 942 526 | 09/1999 | |
| | WO 98/47221 | 10/1998-- | |
| Figures 1-3 and 4 | Please replace existing Figures 1-3 and 4 with attached Figures 1-3 and 4 | | |
| Column 7, line 27, Claim 11 | Replace "signals, and" With --signals; and-- | | |

This certificate supersedes Certificate of Correction issued August 21, 2007.

Signed and Sealed this

Eighteenth Day of September, 2007

JON W. DUDAS  
*Director of the United States Patent and Trademark Office*

United States Patent
Björk et al.

(10) Patent No.: US 6,891,423 B2
(45) Date of Patent: May 10, 2005

(54) QUADRATURE SWITCHING MIXER WITH REDUCED LEAKAGE

(75) Inventors: Christian Björk, Lund (SE); Magnus Wiklund, Lund (SE); Sven Mattisson, Bjärred (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 58 days.

(21) Appl. No.: 10/383,370

(22) Filed: Mar. 6, 2003

(65) Prior Publication Data

US 2003/0222702 A1 Dec. 4, 2003

Related U.S. Application Data (60) Provisional application No. 60/370,322, filed on Apr. 4, 2002.

(51) Int. Cl.$^7$ ................................................ G06G 7/12
(52) U.S. Cl. ................................................ 327/355
(58) Field of Search ........................ 327/355, 356, 327/357, 359, 361; 455/189.1, 326, 333, 209

(56) References Cited

U.S. PATENT DOCUMENTS

| | | |
|---|---|---|
| 5,155,724 A | 10/1992 | Edwards |
| 5,410,743 A | 4/1995 | Seely et al. |
| 6,026,287 A | 2/2000 | Puechberty et al. |
| 6,124,761 A * | 9/2000 | Robinson et al. ......... 330/254 |
| 6,226,509 B1 | 5/2001 | Mole et al. |
| 6,417,712 B1 * | 7/2002 | Bernds et al. ............ 327/248 |
| 2001/0027095 A1 | 10/2001 | Wang |
| 2001/0036818 A1 | 11/2001 | Dobrovolny |

FOREIGN PATENT DOCUMENTS

| | | |
|---|---|---|
| DE | 195-23-433 A1 | 1/1997 |
| DE | 198-19-092 A1 | 11/1998 |
| EP | 1 137 168 A2 | 9/2001 |
| GB | 2 249 679 A | 5/1992 |
| GB | 2 341 502 A | 3/2000 |

OTHER PUBLICATIONS

Wiklund, et al, "A 2Ghz Image–Reject Receiver in a Low IF Architecture Fabricated in a 0.1 $\mu$m CMOS Technology"; Apr. 4, 2002, Lund, Sweden.
Abidi, A., "CMOS Wireless Transceivers: The New Wave", IEEE Communications Magazine, Aug. 1, 1999, vol. 37, No. 8, (pp. 119–124).
Butler, N., International Search Report completed by European Patent Office on Nov. 27, 2003 (7 pages).

* cited by examiner

*Primary Examiner*—My-Trang Nu Ton
(74) *Attorney, Agent, or Firm*—Jenkens & Gilchrist, P.C.

(57) ABSTRACT

A quadrature switching mixer is provided for mixing a received RF signal and a local oscillator signal, while rejecting an image signal associated with the RF signal. Input signal components in quadrature, that is, I and Q input components derived from the received RF signal, are respectively coupled through first and second input paths to corresponding commuting switches in a configuration of switches. Each of the switches operates to multiply respective quadrature components of RF and local oscillator signals to provide quadrature output signal components. A unidirectional device, such as a buffer amplifier included in a signal splitter, is placed in each input path to prevent any portion of an output signal component from leaking backward through one of the input paths to the other input path, and thus to the other output signal component.

26 Claims, 4 Drawing Sheets